United States Patent
Homola

(10) Patent No.: US 8,038,863 B2
(45) Date of Patent: Oct. 18, 2011

(54) COMPOSITE STAMPER FOR IMPRINT LITHOGRAPHY

(75) Inventor: Andrew M. Homola, Morgan Hill, CA (US)

(73) Assignee: WD Media, Inc., San Jose, CA (US)

( * ) Notice: Subject to any disclaimer, the term of this patent is extended or adjusted under 35 U.S.C. 154(b) by 188 days.

(21) Appl. No.: 12/576,430

(22) Filed: Oct. 9, 2009

(65) Prior Publication Data

US 2010/0024962 A1    Feb. 4, 2010

Related U.S. Application Data

(62) Division of application No. 10/741,316, filed on Dec. 19, 2003, now Pat. No. 7,632,087.

(51) Int. Cl.
*C25D 1/00* (2006.01)

(52) U.S. Cl. ............ 205/70; 425/385

(58) Field of Classification Search .......... 205/69, 205/70; 425/385
See application file for complete search history.

(56) References Cited

U.S. PATENT DOCUMENTS

| | | |
|---|---|---|
| 2,621,591 A | 12/1952 | Henderson |
| 4,238,179 A | 12/1980 | Llabres et al. |
| 4,243,367 A | 1/1981 | Renoux |
| 4,262,875 A | 4/1981 | Nyman et al. |
| 4,349,499 A | 9/1982 | Johnston |
| 5,078,947 A | 1/1992 | Nishizawa et al. |
| 5,284,435 A | 2/1994 | Nuij et al. |
| 5,427,599 A | 6/1995 | Greschner et al. |
| 5,480,596 A | 1/1996 | Okubo et al. |
| 5,772,905 A | 6/1998 | Chou |
| 5,795,596 A | 8/1998 | Stanton et al. |
| 5,817,242 A | 10/1998 | Biebuyck et al. |
| 5,925,259 A | 7/1999 | Biebuyck et al. |
| 6,017,657 A | 1/2000 | Mentz et al. |
| 6,027,595 A | 2/2000 | Suleski |
| 6,165,391 A | 12/2000 | Vedamuttu |
| 6,309,580 B1 | 10/2001 | Chou |
| 6,517,995 B1 | 2/2003 | Jacobson et al. |
| 6,596,346 B2 | 7/2003 | Bernard et al. |
| 6,869,557 B1 | 3/2005 | Wago et al. |
| 6,949,199 B1 | 9/2005 | Gauzner et al. |
| 7,632,087 B2 | 12/2009 | Homola |
| 2001/0000745 A1 | 5/2001 | Kerfeld |
| 2002/0032251 A1 | 3/2002 | Ha et al. |
| 2003/0175427 A1 | 9/2003 | Loo et al. |
| 2005/0126406 A1 | 6/2005 | Fawcett et al. |

FOREIGN PATENT DOCUMENTS

| | | |
|---|---|---|
| WO | WO 97/06012 | 2/1997 |
| WO | WO 03/057487 | 7/2003 |

OTHER PUBLICATIONS

Office Action dated Nov. 24, 2010 in corresponding Japanese Application 2004-365869, 3 pages.
Millenium Industrial Tire, website 2009, http://www.milleniumtire.com/html/content/MTPolyPremium.htm, chart with comparison of Shore 00 and Shore A.
Rubber Mill, website 2009, http://www.rubbermill.com/durometer.html, chart of Approximate Durometer Hardness Comparisons.

(Continued)

*Primary Examiner* — Luan Van

(57) ABSTRACT

A stamper having a patterned layer composed of a hard material and a compressible material back plane layer. The back plane layer may be composed of an elastomer. The stamper may be used to imprint an embossable layer disposed above a substrate for the production of a magnetic recording disk.

4 Claims, 6 Drawing Sheets

OTHER PUBLICATIONS

Dow Corning Corporation, Sylgard® 184 Silicon Elastomer Base, Material Safety Data Sheet, Revision Date Mar. 9, 2007, Version 2.0, pp. 1-7.

"Fast, Low-Temperature Electroplating of Hard Glassy Metals", Technology Opportunity, Optics Technology, National Aeronautics and Space Administration, Jul. 15, 2003, 2 pages.

"Printing meets lithography: Soft approaches to high-resolution patterning", IBM J. Res. & Dev. vol. 45, No. 5, Sep. 2001, pp. 697-719.

"Material Hardness", downloaded from http://;www.cake.umd.edu/general/Facilities/Hardness_ad.htm, 22 pages, 2001 by CALCE and the University of Maryland.

Office Action dated Mar. 12, 2007 from U.S. Appl. No. 10/741,316, 10 pages.

Office Action dated Sep. 6, 2007 from U.S. Appl. No. 10/741,316, 7 pages.

Office Action dated Apr. 7, 2008 from U.S. Appl. No. 10/741,316, 5 pages.

Office action dated Oct. 31, 2008 from U.S. Appl. No. 10/741,316, 5 pages.

Office Action dated Jan. 22, 2009 from U.S. Appl. No. 10/741,316, 4 pages.

Office Action dated May 13, 2009 from U.S. Appl. No. 10/741,316, 11 pages.

Notice of Allowance dated Jul. 31, 2009 from U.S. Appl. No. 10/741,316, 17 pages.

Final Office Action dated Aug. 28, 2009 from U.S. Appl. No. 11/811,194, 30 pages.

Office Action dated Feb. 19, 2009 from U.S. Appl. No. 11/811,194, 14 pages.

Office Action dated Nov. 24, 2010 in corresponding Japanese Application 2004-365869, 3 pages.

COMPOSITE STAMPER FOR IMPRINT LITHOGRAPHY

REFERENCE TO RELATED APPLICATION

This application is a divisional of Ser. No. 10/741,316 filed Dec. 19, 2003, which is hereby incorporated by reference.

TECHNICAL FIELD

Embodiments of this invention relate to the field of manufacturing and, more particularly, to stampers for imprint lithography.

BACKGROUND

Stamps are used in a variety of applications and for various purposes. Areas of stamp use include micro contact printing ($\mu$CP) and nano transfer printing (nTP). Contact, or transfer, printing relies on surface chemistries for transferring thin films from the raised regions of a stamp to a substrate when these two elements are brought into physical contact. This technique is an additive process utilizing patterning approaches referred to as soft lithography. An article entitled "Printing meets lithography: Soft approaches to high-resolution patterning," by B. Michel et al., IBM J. Res. & Dev. Vol. 45 No. 5 Sep. 2001, describes the use of an elastomer stamp in micro contact printing. The described elastomer stamp (a.k.a. hybrid printing stamp) is composed of a patterned elastomeric layer attached to a compressible back plane of supporting material (such as a metal), as illustrated in FIG. 1A. The patterned elastomeric layer of the stamp is inked and then printed onto a hard substrate, forming a monolayer of ink on the hard substrate, as illustrated in FIG. 1B. Transfer printing utilizing such a stamp is performed with the application of only a small pressure.

In contrast to contact printing, embossing is an imprinting process that displaces or molds a layer of material with a stamper. The imprinting process requires a greater amount of applied pressure than with stamps used in contact printing. A trend in embossing is the development of nano imprint lithography (NIL) techniques. NIL techniques are being used in the disk drive industry to produce discrete track recording (DTR) magnetic disks. DTR disks typically have a series of concentric raised areas (a.k.a. hills, lands, elevations, etc.) storing data and recessed areas (a.k.a. troughs, valleys, grooves, etc.) that provide inter-track isolation to reduce noise. Such recessed areas may also store servo information. The recessed areas separate the raised areas to inhibit or prevent the unintended storage of data in the recessed areas.

NIL involves the use of a pre-embossed hard forming tool (a.k.a. stamper, embosser, etc.) having an inverse (negative replica) of a DTR pattern. The stamper is pressed onto a thin layer of polymer on a disk substrate. The stamper and polymer/substrate may each be heated, coupled and then the stamper is removed leaving an imprint of the DTR pattern on the polymer layer.

One requirement of an NIL technique in the production of DTR magnetic disks is the ability to produce sub 100 nanometer (nm) features in a reliable way. In the imprinting process, the polymer thickness may typically be in the range of 40 to 500 nm, which may be less than the thickness variation of a stamper and the polymer/substrate surface. NIL requires application of a stamper that allows for good compliance or parallelism between the polymer/substrate surface and the stamper surface. The compliance between the surfaces is limited by surface morphology of the imprinted surface and also by the thickness of the stamper. One problem with conventional NIL stampers, which are typically around 300 microns thick, is that they may not provide for good compliance between the disk surface and the stamper surface due to their thickness. While it is possible to increase compliance by reducing the thickness of the stamper, such an approach may not be acceptable since a very thin stamper would be difficult to handle during its formation (such as during a plating operation) and also during mounting of the stamper into a press system.

A problem with using the patterned elastomer layer printing stamps or hybrid printing stamps described above for imprinting operations is that such stamps may not be sufficiently hard for embossing operations. Such stamps may be too soft for generating sharp and fine grooves or other similar embossed structures that may be need for imprinting operations and may not have sufficient durability for the large number of imprints performed in manufacturing. Such stamps may be limited to use in contact printing operations that utilize low stamping pressure.

One patent, U.S. Pat. No. 6,517,995, describes the use of an elastomeric stamp in a liquid embossing process. In such an embossing process, a thin film of material is deposited on a substrate. The deposited material is either originally present as a liquid or subsequently liquefied prior to embossing. The material is patterned by embossing at a low pressure using a patterned elastomeric stamper. The patterned liquid is then cured to form a functional layer. Such a stamper, however, may be limited to use only with a liquid embossing process that utilizes a low stamping pressure and a liquid embossing substance.

BRIEF DESCRIPTION OF THE DRAWINGS

The present invention is illustrated by way of example, and not limitation, in the figures of the accompanying drawings in which.

DETAILED DESCRIPTION

Figure 1A:
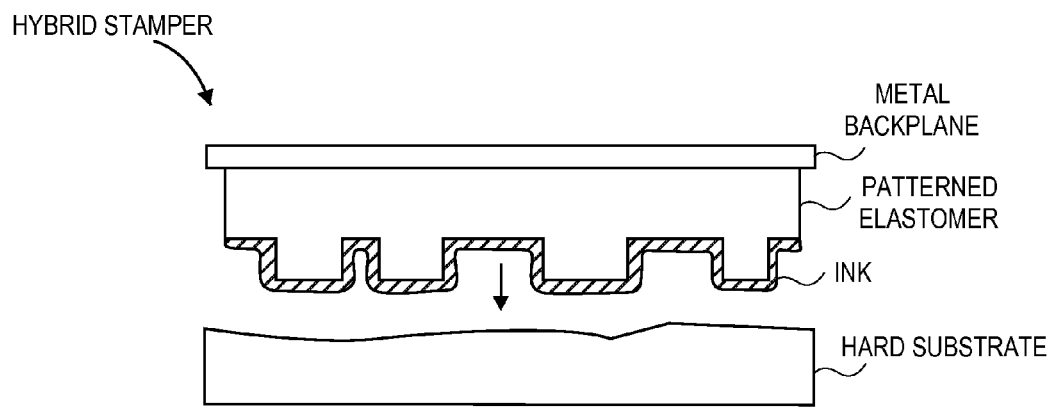
FIG. 1A illustrates a prior stamp composed of a patterned elastomeric layer attached to a compressible back plane of supporting material.
Figure 1B:
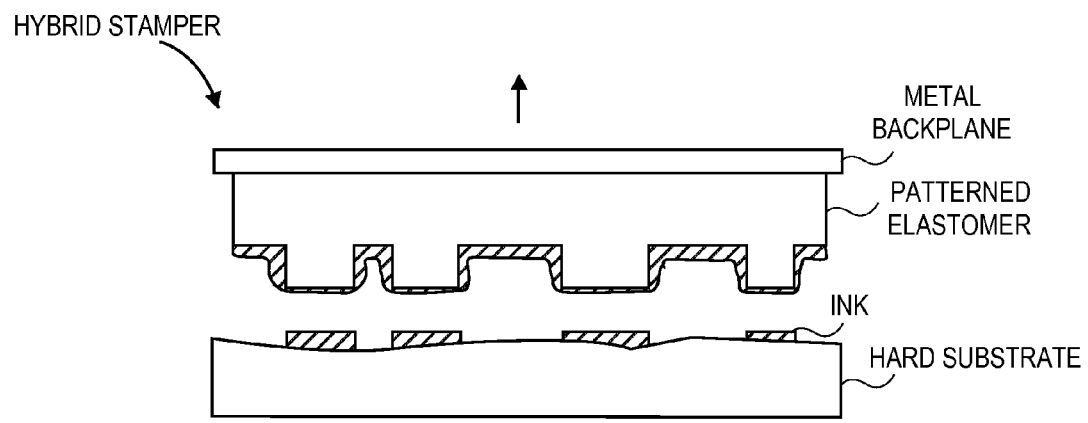
FIG. 1B illustrates a contacting printing process that forms an ink layer on a hard substrate using the stamp of FIG. 1A.

In the following description, numerous specific details are set forth such as example of specific materials or components in order to provide a thorough understanding of the present invention. It will be apparent, however, to one skilled in the art that these specific details need not be employed to practice the invention. In other instances, well known components or methods have not been described in detail in order to avoid unnecessarily obscuring the present invention.

The terms "above," "on," "below" as used herein refer to a relative position of one layer or component with respect to other layers or components. As such, one layer or component above or on another layer or component may be directly in contact with the other layer or component, or may have one or more intervening layers or components. Furthermore, one layer or component deposited or disposed between layers or components may be directly in contact with the layers/components or may have one or more intervening layers/components.

It should be noted that the apparatus and methods discussed herein may be used to fabricate various types of disks. In one embodiment, for example, the apparatus and methods discussed herein may be used to fabricate a magnetic recording disk. Alternatively, the apparatus and methods discussed herein may be used to fabricate other types of digital recording disks, for example, optical recording disks such as a compact disc (CD) and a digital-versatile-disk (DVD). In yet other embodiments, the apparatus and methods discussed herein may be used in other applications, for example, the production of semiconductor devices, and liquid crystal display panels.

A composite stamper having a compressible back plane layer coupled to a hard material imprinting structure is described. The hard material may also be a rigid material. In one embodiment, the imprinting structure of the stamper may be formed by electroplating a mold with a hard material, for example, nickel (Ni) to produce a hard material patterned layer and then disposing a polymerized layer of elastomer on the back plane (side opposite that of the imprinting pattern) of the hard layer. The bonding of such an elastomer to the hard material patterned layer may allow for easy handling of the stamper and may also assure a uniform pressure distribution and good compliance during imprinting. In one embodiment, the patterned layer may be thin relative to a thicker elastomer layer. The stamper, or embossing tool, may be used to create a discrete track pattern on an embossable layer material (e.g., deformable solid) disposed above a substrate for the production of a magnetic recording disk. Where the stamper is to be used for the imprinting of an embossable layer on a disk shaped substrate (e.g., a magnetic recording disk substrate), the stamper may have a corresponding disk shape. In such an embodiment, a dimension of the stamper may be referred to as a diameter. Alternatively, the stamper may be oversized and/or different shaped relative to the size and shape of the substrate and/or embossable layer to be imprinted. In alternative embodiments, the stamper may have other shapes and other corresponding dimensions (e.g., widths and lengths).

The apparatus and methods discussed herein may enable the production of, for example, sub 100 nanometer (nm) features in an embossable layer in a reliable manner. In the imprinting process, the embossable layer thickness may be, for example, in the range of 10 to 500 nm, which may be less than the thickness variation of a stamper and the embossable layer/substrate surface. The apparatus and methods discussed herein may facilitate good compliance or parallelism between an embossable layer/substrate surface and a stamper surface. It should be noted that although the apparatus and methods are discussed herein in relation to nano imprint lithography, the apparatus and methods may also be used with other scale (e.g., micro) imprint lithography techniques.

The following discussion is made in reference to FIGS. 2A-2E and FIG. 3 that illustrate one embodiment of a method of producing a composite stamper and its structure. In one embodiment, a hard patterned layer 210 of composite stamper 200 may be formed from a master template 110 of FIG. 2A. The generation of a master template is known in the art; accordingly, a detailed description is not provided. For the discrete track media, the shape of the master template 110 will end up being the desired pattern to be embossed into an embossable layer (e.g., a polymer) of a magnetic recording disk. As such, the surface topography of the master template 110 is used to generate the shape of the patterned layer 210 that is the inverse of the pattern that will be embossed into the embossable layer of the magnetic recording disk. The patterned layer 210 may have, for example, shape features having a lateral dimension less than approximately 100 nm. Alternatively, patterned layer 210 may have shaped features greater than 100 micron.

In one embodiment, a patterned layer 210 is generated by, for example, electroforming a hard material (e.g., Ni) on top of the master template 110, step 310. The Ni metal alloy may be, for example, electro-plated onto the master template 110. In an alternative embodiment, NiP may be plated (e.g., via electro-deposition or electroless deposition) on the master template 110. Alternatively, other hard metals or metal alloy materials may be used for patterned layer 210, for example, chromium. In one embodiment, for example, the hardness of the material for patterned layer 210 may be approximately in the range of HV100 to HV1000 on the Vickers hardness test and HK60 to HK1000 on the Knoop hardness test. Exemplary hardness values for various metals and metal alloys that may be used are as follows: Ni~HK550, Cr~HK930, and NiP (after plating) ~HK500-HK600. These hardness values are only exemplary and these metals/metal alloys may have other hardness values.

It should be noted that plating is one of several additive processes that may be used to form patterned layer 210. Alternatively, other additive processes, for example, spin coating, dip coating, CVD and sputtering may be used. In alternative embodiments, subtractive processes such as reactive ion etching (e.g., of quartz or Ni material) may be used.

Figure 2A:
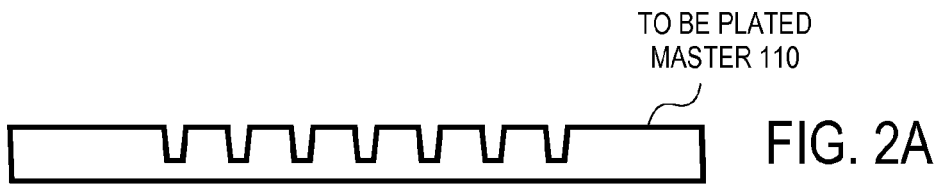
FIGS. 2A-2E are cross sectional views illustrating one embodiment of the structures of a composite stamper during its fabrication.
Figure 2B:
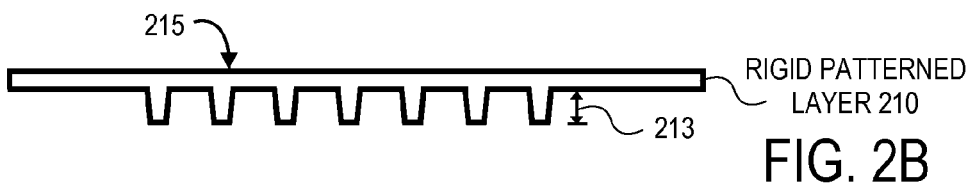

Furthermore, other hard materials may also be used for the patterned layer 210, for example, glass and ceramic. In one embodiment, after formation, the patterned layer 210 may be separated from master 110. Alternatively, the patterned layer 210 may be separated from master 110 at other stages, for example, after the back plane layer 220 is cured, as discussed below. The separated patterned layer 210 is illustrated in FIG. 2B. In one embodiment, the raised areas of the patterned layer 210 may have an approximate height 213, for example, on the order of 0.1 microns. Alternatively, the raised areas of the patterned layer 210 may have other heights.

Figure 2C:
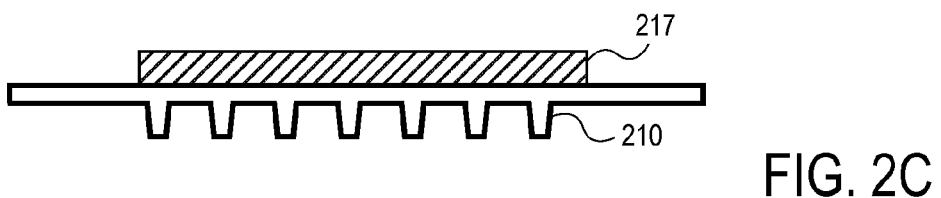
Figure 2D:
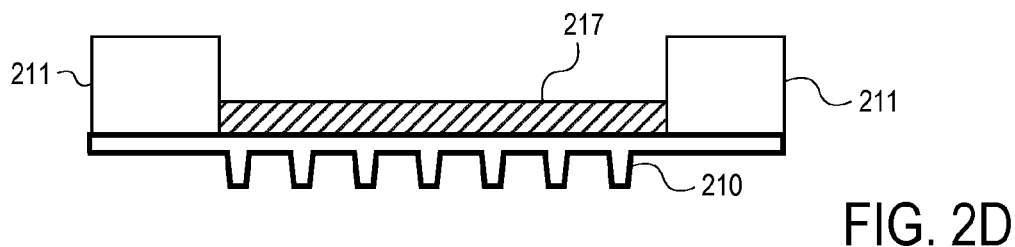

Next, in one embodiment, a masking layer 217 may be applied to the back plane surface 215 of the patterned layer 210, step 330, as illustrated in FIG. 2C. The masking layer 217 enables the formation of outer wall on the back plane surface 215 of the patterned layer, step 340, as illustrated in FIG. 2D. The masking layer 217 may be composed of various materials, for example, a photoresist. Masking layers are known in the art; accordingly a detailed discussion is not provided. In one embodiment, the outer wall 211 may be formed on the back plane surface 215 of patterned layer 210, around masking layer 217, by plating. Alternatively, other methods may be used to generate outer wall 211. The outer wall 211 may be of the same or different material than the material used for patterned layer 210. The use of outer wall 211 on stamper 200 may prevent the compressible material 220 from being squeezed laterally outwards during pressing of stamper 200 into an embossable material as discussed below in relation to FIG. 4.

Figure 2E:
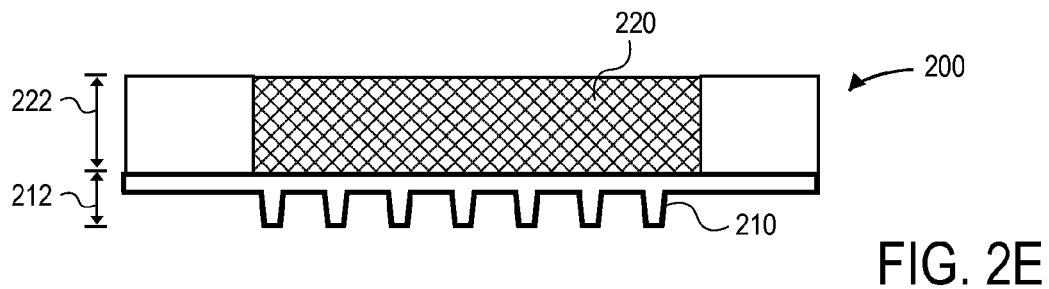
Figure 3:
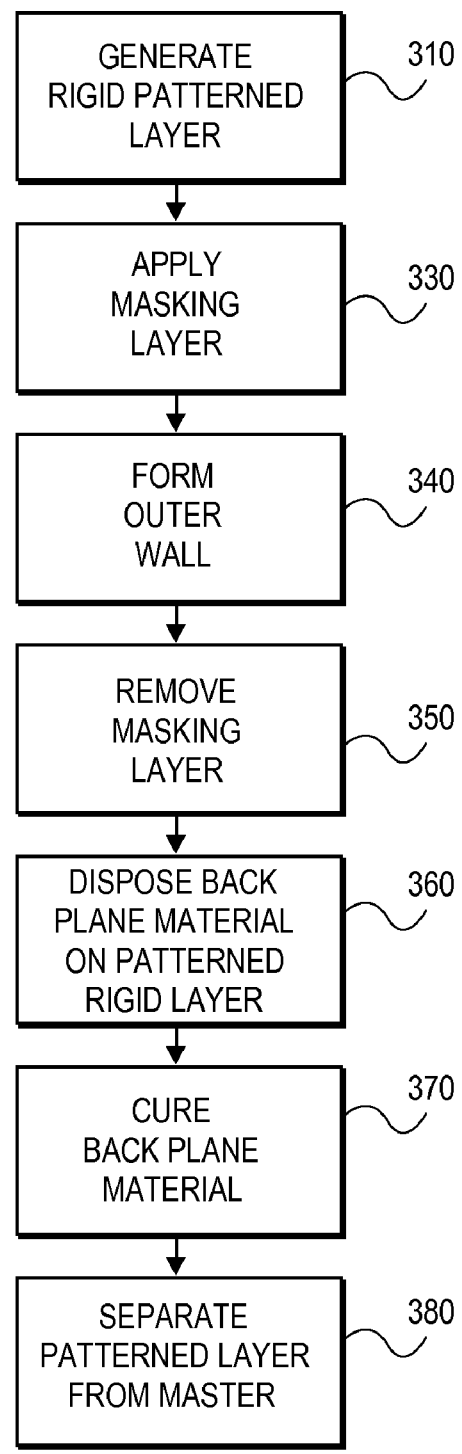
FIG. 3 illustrates one embodiment of a method of fabricating a composite stamper.

Next, the masking layer 217 is removed, step 350, and then a compressible material 220 is disposed on the back plane surface 215 area of the patterned layer 210 within the cavity formed by outer wall 211, step 360, as illustrated in FIG. 2E. The compressible back plane material 220 may be generated in situ or, alternatively, applied using other techniques. For example, the top surfaces of wall 211 may be masked and then recessed area of surface 215 coated with a liquid that is subsequently solidified. Alternatively, the patterned layer's back plane may be coated using other techniques, for example, chemical vapor deposition (CVD), and dip-coating or spin-coating where a very thin film is to be used.

Next, the material of back plane layer 220 may be cured, step 370. In one embodiment, curing may be performed by heating stamper 200 to expose the back plane layer 220 to an elevated temperature for some duration. Heating may be performed to effect a strong attachment between back plane material and the hard material of patterned layer 210. In one embodiment, the curing may be performed in approximately the range of room temperature to 150 degrees Centigrade (C) with the curing time being approximately in the range of 24 hours to 15 minutes, respectively. In other embodiments, other temperatures and curing times may be used. Alternatively, the material of back plane layer 220 may be cured without heating, for example, by waiting a certain amount of time before use of stamper 200. If not already separate, the patterned layer 210 may be separated from master 110, step 380.

In one embodiment, the compressible back plane layer 220 may be composed of a silicon elastomer, for example, SYLGARD 184™ available from Dow Corning Corporation of Michigan. Alternatively, other types of elastomers, for example, urethanes can be used. The elastomer used for compressible back plane layer 220 may have a hardness value, for example, in the approximate range of 20 to 55 on the Shore 00 scale and between 10 and 100 on the Shore A scale. Alternatively, other compressible materials of other hardness values may be used. It should be noted that although layer 220 may be discussed, at times, in relation to an elastomer, other types of materials, such as a UV curable material (with such material, correspondingly, UV cured in step 370) may be used for compressible back plane layer 220. Yet other thermosetting or radiation setting materials may be used for back plane layer 220. The particular material selected for use as compressible back plane layer 220 may be based on various factors including, for example, its thermal resistance, hardness, adhesion to the patterned layer material and resilience to repeated pressure events.

In one embodiment, the thickness 222 of the back plane layer 220 may be approximately equal to or greater than the thickness 212 of the patterned layer 210. For example, the thickness 212 of the patterned layer 210 may be approximately in the range of 1 to 100 microns and the thickness 222 of the back plane layer 220 may be approximately in the range of 100 microns to 5 millimeters. The use of a thin patterned layer 210 with a thickness equal to or greater than the thickness of compressible (e.g., elastomer material) back plane layer 220 may allow for easy handling of stamper 200 and may assure a more uniform pressure distribution and good compliance during imprinting of an embossable layer, as illustrated in FIG. 4.

Figure 4:
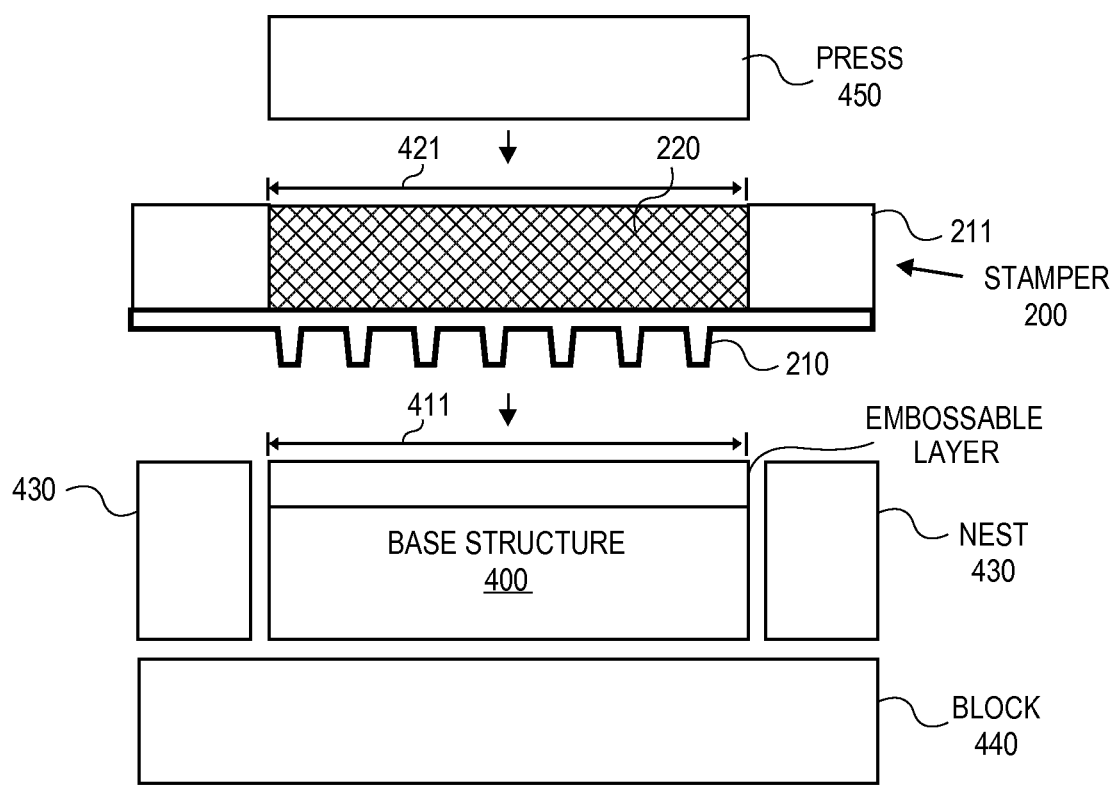
FIG. 4 illustrates one embodiment of an imprinting method using the composite stamper of FIG. 2E.

FIG. 4 illustrates one embodiment of an imprinting method using the composite stamper of FIG. 2E. A base structure 400, having an embossable layer 410 disposed thereon, is placed in a nest 430. In one embodiment, embossable layer 410 may be a deformable solid. In one embodiment, base structure 400 may be a substrate used for a magnetic recording disk. In such an embodiment, stamper 200 may be used for the imprinting of embossable layer 410 for the production of magnetic recording disks. The magnetic recording disk may be, for example, a discrete track longitudinal magnetic recording disk having, for example, a nickel-phosphorous (NiP) plated substrate as a base structure 400. Alternatively, the magnetic recording disk may be a discrete track perpendicular magnetic recording disk having a soft magnetic film disposed above a substrate for the base structure 400. In the embodiment where base structure 400 is disk shaped, nest 430 may be an annular ring having approximately the same thickness as the embossable layer 410/base structure 400 for securing the base structure 400. In embodiments where base structure has other shapes (e.g., square, rectangular, etc.) nest 430 may be similarly shaped to secure the base structure. Such a nest 430 may prevent the stamper 200 from wrapping around the edge of embossable layer 410/base structure 400 and facilitate greater compliance near the outer edge of embossable layer 410.

After base structure 400 is positioned in nest 430, stamper 200 may be positioned and aligned over the base structure. Stamper 200 is brought into contact with embossable layer 410 and a press 450 is used to apply pressure to stamper 200 in order to imprint the embossable layer 410 with the patterned layer 210. In one embodiment, for example, the pressure applied to the stamper 200 may be approximately in the range of 10 to 2,000 psi. Alternatively, other pressures may be used. In one embodiment, the diameter of the press 450 may be approximately the same as the diameter 421 of the back plane layer 220. Alternatively the diameter of the press 450 may be less than or greater than the diameter 421 of the back plane layer 220. In one embodiment, the embossable layer 410 thickness may be, for example, in approximately the range of 40 to 500 nm, which may be less than the thickness variation of stamper 200 and the embossable layer 410/base structure 400 surface.

In the illustrated embodiment of FIG. 4, only a single side of base structure 400 having embossable layer 410 is imprinted. In such an embodiment, block 440 may represent a hard, flat planar surface. Alternatively, imprinting may be performed simultaneously on embossable layers residing on both sides of base structure 400. In such an embodiment, block 440 represents a stamper and press for imprinting an embossable layer on that side of base structure 440.

In another embodiment, the diameter 421 of the back plane layer 220 may be approximately equal to or greater than the diameter 411 of the area of the embossable layer 410 to be imprinted by the patterned layer 210. Alternatively, the diameter 421 of the back plane layer 220 may be less than the diameter 411 of the area of the embossable layer 410 to be imprinted by the patterned layer 210.

In one embodiment, a release layer (not shown) may be disposed on the patterned layer 210 of stamper 200 and/or the embossable layer 410 before imprinting to facilitate separation of the stamper 200 from the embossable layer 410 after imprint.

Figure 5A:
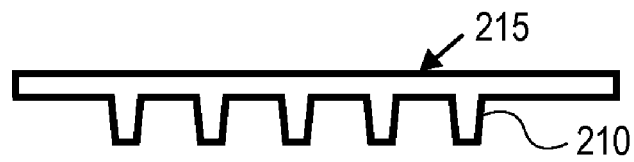
FIGS. 5A-5C are cross sectional views illustrating an alternative embodiment of the structures of a composite stamper at different stages of its fabrication.
Figure 5B:
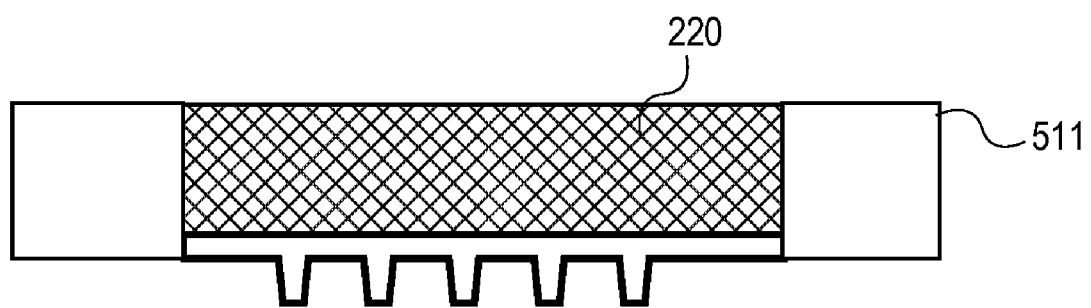
Figure 5C:
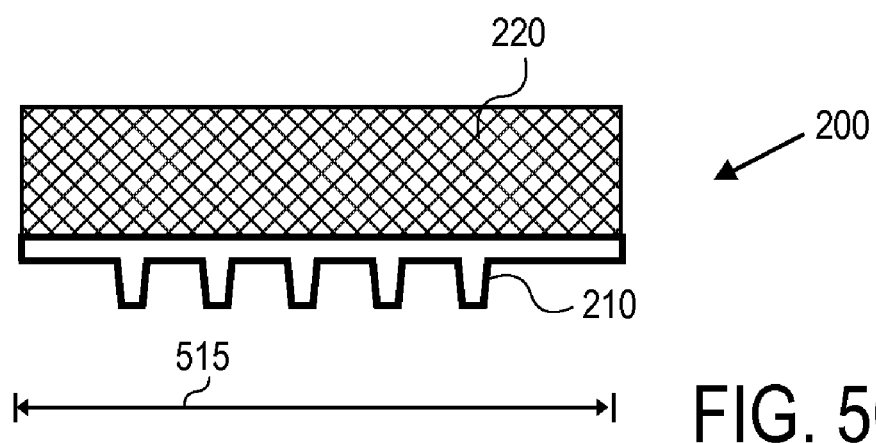

FIGS. 5A-5C illustrate an alternative embodiment of a method of producing a composite stamper and its structure. Patterned layer 210 of FIG. 5A may be formed in a manner similar to that discussed above with respect to FIGS. 2A and 2B. In this embodiment, a side wall 511 may be added around the edge of patterned layer 210, forming a cavity above the entire back plane surface 215 area of layer 210. A compressible material 220 is disposed on the entire back plane surface 215 of the patterned layer 210 within the side wall 511, as illustrated in FIG. 5B. The compressible back plane layer 220 may be generated in a manner similar to that discussed above with respect to FIG. 2E. The side wall 511 may then be removed to produce a stamper 200 having compressible back plane layer 220 dispose along the entire diameter 515 of stamper 200, as illustrated in FIG. 5C.

It should be noted that the patterned layer 210 has been shown with raised structures across most of its diameter for illustrative purposes only. The patterned layer 210 may have an imprinting structure along only certain portions of its diameter, or other dimension. For example, patterned layer 210 may be structured to provide an imprinting structure for an area of the embossable layer 410 residing above a portion of the base structure 400 to be used for a data zone of a magnetic recording disk while having no imprinting structure, or a different imprinting structure (e.g., different raised area to recesses area ratio), for an area of the embossable layer 410 residing above a portion of the base structure 400 to be used for a landing zone and/or a transition zone. It should also be noted that the ratio of the raised areas to recessed areas of patterned layer 210 need not be uniform across the patterned layer 210.

As previously noted, the apparatus and methods discussed herein may be used with various types of base structures (e.g., wafer and panel oxide/substrates) having an embossable layer disposed thereon. In an alternative embodiment, for example, the imprinting apparatus and methods discussed herein may be used to fabricate semiconductor devices such as, for example, a transistor. In such a fabrication, an embossable layer may be disposed above a base structure of, for example, an oxide (e.g., $SiO_2$) layer on top of a silicon wafer substrate. A stamper may be generated with a patterned structure for active areas of the transistor. The stamper is imprinted into the embossable layer with the embossed pattern transferred into the oxide layer using etching techniques (e.g., reactive ion etching). Subsequent semiconductor wafer fabrication techniques well known in the art are used to produce the transistor.

In an alternative embodiment, for example, the imprinting apparatus and methods discussed herein may be used to fabricate pixel arrays for flat panel displays. In such a fabrication, an embossable layer may be disposed above a base structure of, for example, an indium tin oxide (ITO) layer on top of a substrate. The stamper is generated with a patterned layer being an inverse of the pixel array pattern. The stamper is imprinted into the embossable layer with the embossed pattern transferred into the ITO using etching techniques to pattern the ITO layer. As a result, each pixel of the array is separated by an absence of ITO material (removed by the etching) on the otherwise continuous ITO anode. Subsequent fabrication techniques well known in the art are used to produce the pixel array.

In yet another embodiment, as another example, the imprinting apparatus and methods discussed herein may be used to fabricate lasers. In such a fabrication, embossable material areas patterned by the stamper are used as a mask to define laser cavities for light emitting materials. Subsequent fabrication techniques well known in the art are used to produce the laser. In yet other embodiments, the apparatus and methods discussed herein may be used in other applications, for example, the fabrication of multiple layer electronic packaging and optical communication devices, and contact/transfer printing.

In the foregoing specification, the invention has been described with reference to specific exemplary embodiments thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method of manufacturing a production stamper for imprinting a recording disk, comprising:
    generating a patterned layer comprising a hard material and having a first diameter, the patterned layer having a back plane bounded by an outer wall forming a cavity, the patterned layer comprising a hard material, the patterned layer having a first thickness in a range of 1 to 300 microns; and
    directly bonding an elastomer on the back plane of the patterned layer within the cavity of the outer wall, the elastomer having a second thickness being approximately equal to or greater than the first thickness of the patterned layer, the second thickness being greater than 300 microns, the elastomer having a second diameter being less than the first diameter, wherein
    the hard material has a hardness value in a range of HV100 to HV1000, and
    the elastomer having a hardness value in a range of 20 to 55 Shore 00 scale or 10 to 100 on Shore A scale.

2. The method of claim 1, further comprising curing the elastomer.

3. The method of claim 1, wherein generating the patterned layer comprises electroplating a master with a metal.

4. The method of claim 2, wherein curing is performed at a temperature approximately in a range of room temperature to 150 degrees C.

* * * * *